United States Patent
Seki et al.

(10) Patent No.: US 11,974,504 B2
(45) Date of Patent: Apr. 30, 2024

(54) THERMOELECTRIC CONVERSION BODY, THERMOELECTRIC CONVERSION MODULE, AND METHOD FOR MANUFACTURING THERMOELECTRIC CONVERSION BODY

(71) Applicant: LINTEC Corporation, Tokyo (JP)

(72) Inventors: Yuta Seki, Kawasaki (JP); Kunihisa Kato, Warabi (JP); Tsuyoshi Muto, Saitama (JP)

(73) Assignee: LINTEC CORPORATION, Tokyo (JP)

(*) Notice: Subject to any disclaimer, the term of this patent is extended or adjusted under 35 U.S.C. 154(b) by 0 days.

(21) Appl. No.: 17/786,269

(22) PCT Filed: Dec. 1, 2020

(86) PCT No.: PCT/JP2020/044581
§ 371 (c)(1),
(2) Date: Jun. 16, 2022

(87) PCT Pub. No.: WO2021/124860
PCT Pub. Date: Jun. 24, 2021

(65) Prior Publication Data
US 2023/0044413 A1   Feb. 9, 2023

(30) Foreign Application Priority Data

Dec. 16, 2019 (JP) ................... 2019-226631

(51) Int. Cl.
*H10N 10/857* (2023.01)
*H10N 10/01* (2023.01)
*H10N 10/17* (2023.01)

(52) U.S. Cl.
CPC ........... *H10N 10/857* (2023.02); *H10N 10/01* (2023.02); *H10N 10/17* (2023.02)

(58) Field of Classification Search
CPC ....... H10N 10/857; H10N 10/17; H10N 10/01
See application file for complete search history.

(56) References Cited

U.S. PATENT DOCUMENTS

2015/0228879 A1* 8/2015 Kato ................ H10N 10/857
  438/54
2020/0066960 A1   2/2020 Kato et al.
2021/0036202 A1   2/2021 Hara et al.

FOREIGN PATENT DOCUMENTS

JP   2005-114077 A   4/2005
JP   2006-069160 A   3/2006
(Continued)

OTHER PUBLICATIONS

WO-2021065670-A1, Machine Translation (Year: 2021).*
(Continued)

*Primary Examiner* — Devina Pillay
(74) *Attorney, Agent, or Firm* — Rimon P.C.

(57) ABSTRACT

Provided are: a thermoelectric conversion body that has high electrical conductivity, achieving high thermoelectric conversion efficiency when used in a thermoelectric conversion module, and is less susceptible to warpage during manufacture; a method for manufacturing the same; and a thermoelectric conversion module using the same. A thermoelectric conversion body that is a fired product of a composition containing a thermoelectric semiconductor material and a heat resistant resin, wherein, with the heat resistant resin being subjected to temperature elevation and a weight of the heat resistant resin at 400° C. being defined as 100%, a temperature at which the heat resistant resin undergoes a further 5% reduction in weight is 480° C. or lower; a thermoelectric conversion module including the thermoelectric conversion body; and a method for manufacturing the thermoelectric conversion body.

10 Claims, 7 Drawing Sheets

(56) References Cited

FOREIGN PATENT DOCUMENTS

| | | |
|---|---|---|
| JP | 2007-207873 A | 8/2007 |
| JP | 2010-192764 A | 9/2010 |
| JP | 2018-059230 A | 4/2018 |
| JP | 2019-179911 A | 10/2019 |
| WO | 2018/110403 A1 | 6/2018 |
| WO | 2018/179544 A1 | 10/2018 |
| WO | WO-2021065670 A1 * | 4/2021 |

OTHER PUBLICATIONS

International Search Report issued in corresponding International Patent Application No. PCT/JP2020/044581 dated Mar. 2, 2021, with English translation.

* cited by examiner

US 11,974,504 B2

THERMOELECTRIC CONVERSION BODY, THERMOELECTRIC CONVERSION MODULE, AND METHOD FOR MANUFACTURING THERMOELECTRIC CONVERSION BODY

CROSS REFERENCE TO RELATED APPLICATIONS

This application is the U.S. National Phase under 35 U.S.C. § 371 of International Application No. PCT/JP2020/044581, filed on Dec. 1, 2020, which claims the benefit of Japanese Patent Application No. 2019-226631, filed on Dec. 16, 2019, the entire contents of each are hereby incorporated by reference.

TECHNICAL FIELD

The present invention relates to a thermoelectric conversion body, a thermoelectric conversion module, and a method for manufacturing a thermoelectric conversion body.

BACKGROUND ART

As energy conversion technologies involving thermoelectric conversion, thermoelectric power generation technology and the Peltier cooling technology are known. Thermoelectric power generation technology is a technology utilizing the conversion of thermal energy into electrical energy by the Seebeck effect. Because this technology does not require a large cost to operate the thermoelectric conversion element for carrying out thermoelectric conversion, it is attracting great attention as an energy conservation technology that can recover unused waste thermal energy generated from fossil fuel resources used in facilities such as buildings and factories as electrical energy. The Peltier cooling technology is a technology that utilizes the conversion of electrical energy into thermal energy by the Peltier effect as opposed to the thermoelectric generation. This Peltier cooling technology is used in, for example, wine coolers and compact refrigerators that are portable. In addition, this Peltier cooling technology is also used as a cooling means for CPUs used in computers and as a temperature controlling means for components or devices that require precise temperature control (e.g., semiconductor laser oscillator for optical communication).

As a thermoelectric conversion device, a so-called π-type thermoelectric conversion device is known. The π-type thermoelectric conversion device is configured by providing a pair of electrodes arranged apart from each other on a substrate, for example, a P-type thermoelectric element on one electrode, and an N-type thermoelectric element on the other electrode, both of which are also provided apart from each other, and by connecting the upper surfaces of both of the thermoelectric materials to the same electrodes on the opposing substrates to allow both of the elements to conduct (e.g., Patent Document 1). In addition, a so-called in-plane type thermoelectric conversion device is also known. The in-plane type thermoelectric conversion device includes P-type thermoelectric elements and N-type thermoelectric elements alternately provided on a substrate in the in-plane direction, and for example, it is configured by connecting the lower part of the joint between both of the thermoelectric elements through electrodes in series (e.g., see Patent Document 2).

It is known that a thermoelectric conversion body included in a thermoelectric conversion device is produced by film-forming using a thermoelectric semiconductor composition containing thermoelectric semiconductor fine particles and a heat resistant resin, followed by drying, and further firing of the film (e.g., Patent Document 3).

CITATION LIST

Patent Literature

Patent Document 1: JP 2010-192764 A
Patent Document 2: WO 2018/179544
Patent Document 3: WO 2018/110403

SUMMARY OF INVENTION

Technical Problem

In recent years, as thermoelectric conversion devices have become widespread, there has been an increasing demand for improvement in thermoelectric conversion performance. Furthermore, also for thermoelectric conversion body produced by film-formation, drying, and firing by using a thermoelectric semiconductor composition containing thermoelectric semiconductor microparticles and a heat resistant resin, even higher electrical conductivity has been demanded to achieve even higher thermoelectric conversion efficiency in a case where the thermoelectric conversion body is used for a thermoelectric conversion module. Meanwhile, in a manufacturing process including firing, a thermoelectric conversion body is required to be a thermoelectric conversion body, which is less susceptible to warpage, to achieve expected thermoelectric conversion performance.

In light of the issues described above, an object of the present invention is to provide a thermoelectric conversion body that has high electrical conductivity, can exhibit high thermoelectric conversion efficiency when used in a thermoelectric conversion module, and is less susceptible to warpage during manufacture. Another object of the present invention is to provide a thermoelectric conversion module that can exhibit high thermoelectric conversion efficiency. Another object is to provide a method for manufacturing a thermoelectric conversion body that can produce a thermoelectric conversion body having a high electrical conductivity while occurrence of warpage is suppressed.

Solution to Problem

As a result of diligent research to solve the issues described above, the inventors of the present invention found that the issues can be solved by using a composition containing a thermoelectric semiconductor material and a specific heat resistant resin, the specific heat resistant resin having, with the specific heat resistant resin being subjected to temperature elevation and a weight of the specific heat resistant resin at 400° C. being defined as 100%, a temperature at which the specific heat resistant resin undergoes a further 5% reduction in weight, and thus completed the present invention.

That is, the present invention is to provide the following [1] to [10].

[1] A thermoelectric conversion body that is a fired product of a composition including a thermoelectric semiconductor material and a heat resistant resin, wherein, with the heat resistant resin being subjected to temperature elevation and a weight of the heat resistant resin at 400° C. being defined as 100%, a temperature at which the heat resistant resin undergoes a further 5% reduction in weight is 520° C. or lower.

[2] The thermoelectric conversion body according to [1] above, wherein, with the heat resistant resin being subjected to temperature elevation and the weight of the heat resistant resin at 400° C. being defined as 100%, a temperature at which the heat resistant resin undergoes the further 5% reduction in weight is 460° C. or higher.

[3] The thermoelectric conversion body according to [1] or [2] above, having a filling rate of 80% or greater and less than 100% in a vertical cross section including a central part of the thermoelectric conversion body, the filling rate representing a proportion of an area occupied by parts other than voids.

[4] The thermoelectric conversion body according to any one of [1] to [3] above, wherein the heat resistant resin is a polyamide-imide resin.

[5] The thermoelectric conversion body according to any one of [1] to [4] above, which is a fired product of a coating film of the composition.

[6] The thermoelectric conversion body according to any one of [1] to [5] above, wherein the composition further contains at least one of an ionic liquid or an inorganic ionic compound.

[7] A thermoelectric conversion module including a P-type thermoelectric element layer and an N-type thermoelectric element layer, the P-type thermoelectric element layer and the N-type thermoelectric element layer being arranged alternately, wherein at least a pair of adjacent P-type thermoelectric element layer and N-type thermoelectric element layer are arranged apart and have one main surface electrically connected to each other and the other main surface not electrically connected to each other, and at least one of the P-type thermoelectric element layer or the N-type thermoelectric element layer is the thermoelectric conversion body described in any one of [1] to [6] above.

[8] A method for manufacturing the thermoelectric conversion body according to any one of [1] to [6] above, the method including:
coating a support with the composition,
forming a coating film by drying the composition coating the support, and
forming the thermoelectric conversion body by subjecting the coating film to annealing.

[9] The method for manufacturing the thermoelectric conversion body according to [8] above, wherein the forming of the thermoelectric conversion body is performed by subjecting the coating film to pressing, and subjecting the pressed coating film to annealing.

[10] The method for manufacturing a thermoelectric conversion body according to [8] or [9] above, wherein, with the heat resistant resin being subjected to temperature elevation and a weight of the heat resistant resin at 400° C. being defined as 100%, the coating film is annealed at a temperature 30° C. or more lower than a temperature at which the heat resistant resin undergoes a further 5% reduction in weight.

Advantageous Effects of Invention

The thermoelectric conversion body according to an embodiment of the present invention can be a thermoelectric conversion body that has high electrical conductivity, can exhibit high thermoelectric conversion efficiency when used in a thermoelectric conversion module, and is less susceptible to warpage during manufacture. Furthermore, the thermoelectric conversion module according to an embodiment of the present invention can exhibit high thermoelectric conversion efficiency. Furthermore, according to the method for manufacturing a thermoelectric conversion body according to an embodiment of the present invention, a thermoelectric conversion body having a high electrical conductivity while occurrence of warpage is suppressed can be manufactured.

DESCRIPTION OF EMBODIMENTS

Figure 1:
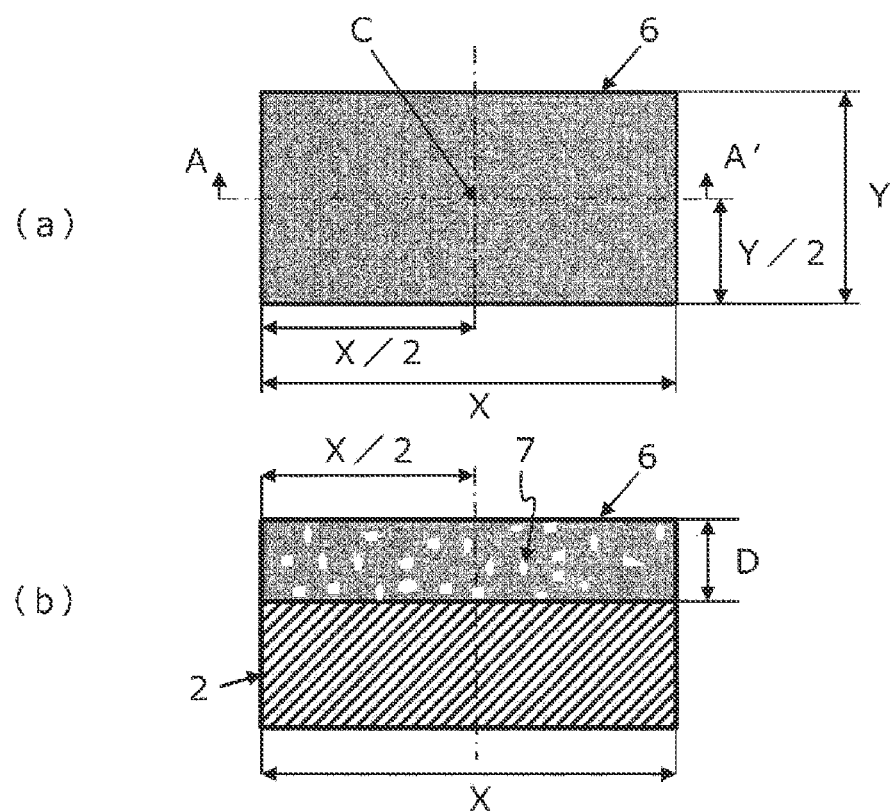
FIG. 1 is cross-sectional schematic views to explain a vertical cross section including a central part of a thermoelectric conversion body.

An embodiment of the present invention (hereinafter, may be also referred to as "present embodiment") will be described below.

Thermoelectric Conversion Body

The thermoelectric conversion body according to an embodiment of the present invention is a fired product of a composition containing a thermoelectric semiconductor material and a heat resistant resin, and, provided that the heat resistant resin being subjected to temperature elevation and a weight of the heat resistant resin at 400° C. being defined as 100%, a temperature at which the heat resistant resin undergoes a further 5% reduction in weight is 520° C. or lower. Hereinafter, the composition containing a thermoelectric semiconductor material and a heat resistant resin is referred to as a thermoelectric semiconductor composition.

The thermoelectric conversion body is used as a chip constituting at least one of N-type thermoelectric conversion layer or P-type thermoelectric conversion layer that is used for a π-type thermoelectric conversion module. Furthermore, the thermoelectric conversion body constitutes at least one of N-type thermoelectric conversion layer or P-type thermoelectric conversion layer that is in a close contact with a substrate in an in-plane type thermoelectric conversion module.

For the thermoelectric conversion body of the present embodiment, with the heat resistant resin being subjected to temperature elevation and a weight of the heat resistant resin at 400° C. being defined as 100%, a temperature at which the heat resistant resin contained in a thermoelectric semiconductor composition, which is a raw material, undergoes a further 5% reduction in weight is 520° C. or lower, which is not too high. Therefore, the thermoelectric semiconductor composition is coated and dried to form a coating film, and in the process of firing the coating film, the heat resistant resin is decomposed appropriately, leading to the suppression of the occurrence of warpage on the thermoelectric conversion body during annealing can be suppressed while reduction in the electric conductivity of the thermoelectric conversion body is avoided.

The thickness of the thermoelectric conversion body is preferably 50 μm or greater, more preferably 75 μm or greater, even more preferably 100 μm or greater, and preferably 1200 μm or less, more preferably 1000 μm or less, and even more preferably 800 μm or less. When the thickness of the thermoelectric conversion body is in the range described above, a thermoelectric conversion body exhibiting excellent thermoelectric conversion performance tends to be productively manufactured.

Note that the electrical conductivity of the thermoelectric conversion body is measured by a method in which the electrical conductivities of test pieces from Examples 3 and 4 described below are measured.

In the vertical cross section including the central part of the thermoelectric conversion body, a filling rate representing a proportion of an area occupied by parts other than voids is preferably 80% or greater and less than 100%, and more preferably 81% or greater and less than 100%, from the perspective of ensuring excellent thermoelectric conversion performance and high electrical conductivity.

In the present specification, "a vertical cross section including a central part of a thermoelectric conversion body" means a cross section obtained by cutting a thermoelectric conversion body, which is two-dimensionally spread, in a thickness direction in a manner that the cut passes the central part when the thermoelectric conversion body is viewed from a normal line direction. Specific description using drawings is as follows.

FIG. 1 is a cross-sectional schematic view of a thermoelectric conversion body to explain "a vertical cross section including a central part of a thermoelectric conversion body". FIG. 1(a) is a plan view of a thermoelectric conversion body, and FIG. 1(b) is a vertical cross section in a thickness direction of a thermoelectric conversion body.

As illustrated in FIG. 1(a), in a case where the thermoelectric conversion body 6 including void parts 7 is in a rectangular form having a length X in a width direction and a length Y in a depth direction, a cross section that includes a central part C (i.e., a position that is X/2 from one edge in the width direction and Y/2 from one edge in the depth direction) of the thermoelectric conversion body 6 and that is formed by the length X and a thickness D obtained by, for example, cutting between A-A' along the width direction of FIG. 1(a) is "the vertical cross section including the central part of the thermoelectric conversion body". Note that, the thermoelectric conversion body may be a thermoelectric conversion body formed on a substrate (sign 2 in FIG. 1(b)) like the thermoelectric conversion body 6 illustrated in FIG. 1(b).

The thermoelectric conversion body is preferably a fired product of a coating film formed by coating a surface of an uncoated portion, such as a support, with a thermoelectric semiconductor composition containing a thermoelectric semiconductor material and a heat resistant resin. Due to the thermoelectric conversion body being a fired product of a coating film of a thermoelectric semiconductor composition, a thermoelectric conversion module in a sheet form can be easily manufactured, and a thermoelectric conversion body having enhanced flexibility is readily obtained.

Thermoelectric Semiconductor Composition

The thermoelectric semiconductor composition that is used to manufacture a thermoelectric conversion body contains at least a thermoelectric semiconductor material and a heat resistant resin and preferably further contains at least an ionic liquid and an inorganic ionic compound.

Heat Resistant Resin

The heat resistant resin contained in the thermoelectric semiconductor composition is used for facilitating the coating by imparting a predetermined viscosity to the thermoelectric semiconductor composition and for allowing the heat resistant resin to serve as a binder between thermoelectric semiconductor materials by binding the thermoelectric semiconductor material after the coating.

The heat resistant resin is not particularly limited; however, a heat resistant resin that maintains, at least partially, various physical properties as a resin such as mechanical strength and thermal conductivity when a thermoelectric semiconductor material undergoes crystal growth by subjecting a thin film formed from the thermoelectric semiconductor composition to, for example, annealing is used.

With the heat resistant resin being subjected to temperature elevation and a weight of the heat resistant resin at 400° C. being defined as 100%, a temperature at which the heat resistant resin undergoes a further 5% reduction in weight (hereinafter, also referred to as "weight reduction temperature") is 520° C. or lower, preferably 510° C. or lower, and more preferably 500° C. or lower. With the heat resistant resin being subjected to temperature elevation and its weight at 400° C. being defined as 100%, by setting the temperature at which the heat resistant resin undergoes a further 5% reduction in weight to 520° C. or lower, a high electrical conductivity of the thermoelectric conversion body obtained by subjecting a thin film formed from the thermoelectric semiconductor composition to annealing can be achieved. It is presumed that this is related to the fact that, because the weight reduction temperature of the heat resistant resin is not too high, decomposition of the heat resistant resin proceeds to some degree during the annealing and the abundance ratio of the heat resistant resin to the thermoelectric semiconductor material is decreased compared to the abundance ratio before the annealing. Furthermore, occurrence of warpage of the thermoelectric conversion body can be suppressed when a thin film formed from the thermoelectric semiconductor composition is subjected to annealing. With the heat resistant resin being subjected to temperature elevation and its weight at 400° C. being defined as 100%, the temperature at which the heat resistant resin undergoes a further 5% reduction in weight is preferably 460° C. or higher, more preferably 465° C. or higher, and even more preferably 470° C. or higher, from the perspectives of facilitating the suppression of occurrence of warpage and ensuring the flexibility of the thermoelectric conversion body. Note that, in the present specification, with the heat resistant resin being subjected to temperature elevation and its weight at 400° C. being defined as 100%, the temperature at which the heat resistant resin undergoes a further 5% reduction in weight (weight reduction temperature) means a temperature obtained by thermogravimetry of the heat resistant resin under the following conditions. By using a thermogravimetry-differential thermal analyzer, 6.8 g of a sample of the heat resistant resin is heated at a temperature increase rate of 10° C./min from 37° C. in a nitrogen atmosphere, and with a weight of the sample at 400° C. defined as 100%, the temperature at which the weight becomes 95% according to this definition is defined as the weight reduction temperature. Note that, in a case where the sample is in a solution state, the solvent is volatilized under conditions at 250° C. for 2 hours, prior to performance of the thermal analysis.

Examples of the heat resistant resin include polyamide resins, polyamide-imide resins, polyetherimide reins, polybenzoxazole resins, polybenzimidazole resins, epoxy resins, and copolymers having chemical structures of these resins. The heat resistant resin may be used alone, or a combination of two or more types of the heat resistant resins may be used. Among these, from the perspectives of achieving even higher heat resistance and not negatively affecting crystal growth of the thermoelectric semiconductor material in the thin film, polyamide resins, polyamide-imide resins, and epoxy resins are preferred; and from the perspective of excellent flexibility, polyamide resins and polyamide-imide resins are more preferred, and polyamide-imide resins are even more preferred. Furthermore, because the polyamide-imide resin does not involve cyclodehydration reaction during annealing unlike polyamic acid and the like, weight reduction during annealing is gradual and prevention of warpage of the thermoelectric conversion body is facilitated, which are particularly preferred.

Furthermore, for the heat resistant resin, the mass reduction percentage at 300° C. measured by thermogravimetry (TG) is preferably 10% or less, more preferably 5% or less, and even more preferably 1% or less. When the mass reduction percentage is in the range described above, as described below, even in a case where a thin film formed from the thermoelectric semiconductor composition is subjected to annealing, functions as a binder are not lost, and flexibility of the thermoelectric conversion material can be maintained.

The blended amount of the heat resistant resin in the thermoelectric semiconductor composition is preferably from 0.1 to 40 mass %, more preferably from 0.5 to 20 mass %, and even more preferably from 1 to 20 mass %. When the blended amount of the heat resistant resin is in the range described above, the thermoelectric conversion body having a high electrical conductivity can be obtained while thermoelectric performance is maintained, and suppression of occurrence of warpage in the manufacturing process can be further facilitated.

Thermoelectric Semiconductor Material

The thermoelectric semiconductor material contained in the P-type thermoelectric element layer and the N-type thermoelectric element layer is not particularly limited as long as the thermoelectric semiconductor material is a raw material that can generate thermoelectromotive force by providing a temperature difference. For example, bismuth-tellurium-based thermoelectric semiconductor materials such as P-type bismuth telluride and N-type bismuth telluride; telluride-based thermoelectric semiconductor materials such as GeTe and PbTe; antimony-tellurium-based thermoelectric semiconductor materials; zinc-antimony-based thermoelectric semiconductor materials such as ZnSb, $Zn_3Sb_2$, and $Zn_4Sb_3$; silicon-germanium-based thermoelectric semiconductor materials such as SiGe; bismuth selenide-based thermoelectric semiconductor materials such as $Bi_2Se_3$; silicide-based thermoelectric semiconductor materials such as $\beta$-$FeSi_2$, $CrSi_2$, $MnSi_{1.73}$, $Mg_2Si$; oxide-based thermoelectric semiconductor materials; Heusler materials such as FeVAl, FeVAlSi, and FeVTiAl; sulfide-based thermoelectric semiconductor materials such as $TiS_2$; and skutterudite materials are used.

Among these, from the perspective of ease in obtaining high thermoelectric conversion performance, a bismuth-tellurium-based thermoelectric semiconductor material, a telluride-based thermoelectric semiconductor material, an antimony-tellurium-based thermoelectric semiconductor material, or a bismuth selenide-based thermoelectric semiconductor material is preferred.

Furthermore, among these, from the perspective of containing no rare metals for which the supply is unstable due to geopolitical issues, a silicide-based thermoelectric semiconductor material is preferred; and from the perspective of making it easy for the thermoelectric conversion module to function in a high temperature environment, a skutterudite material is preferred.

Furthermore, from the perspective of high thermoelectric conversion performance in a low temperature environment, the thermoelectric semiconductor material is preferably a bismuth-tellurium-based thermoelectric semiconductor materials such as P-type bismuth telluride or N-type bismuth telluride.

As the P-type bismuth telluride, a P-type bismuth telluride having a positive hole as a carrier and the Seebeck coefficient of a positive value and, for example, represented as $Bi_XTe_3Sb_{2-X}$ is preferably used. In this case, X is preferably $0 \leq X \leq 0.8$, and more preferably $0.4 \leq X \leq 0.6$. X of greater than 0 and 0.8 or less is preferred because the Seebeck coefficient and electrical conductivity become large, and characteristics as the P-type thermoelectric conversion material are maintained.

Furthermore, as the N-type bismuth telluride, an N-type bismuth telluride having an electron as a carrier and the Seebeck coefficient of a negative value and, for example, represented as $Bi_2Te_{3-Y}Se_Y$ is preferably used. In this case, Y is preferably $0 \leq Y \leq 3$ (when Y=0, $Bi_2Te_3$), and more preferably $0.1 \leq Y \leq 2.7$. Y of 0 or greater and 3 or less is preferred because the Seebeck coefficient and electrical conductivity become large, and characteristics as the N-type thermoelectric conversion material are maintained.

The thermoelectric semiconductor material used in the thermoelectric element layer is preferably in a microparticle form having a predetermined size and, for example, is preferably thermoelectric semiconductor microparticles that have been ground to a predetermined size by using a pulverizing device such as a ball mill.

The blended amount of the thermoelectric semiconductor microparticles in the thermoelectric semiconductor composition is preferably from 30 to 99 mass %, more preferably from 50 to 96 mass %, and even more preferably from 70 to 95 mass %. The blended amount of the thermoelectric semiconductor microparticles in the range described above is preferred because the Seebeck coefficient (absolute value of Peltier coefficient) is large, high thermoelectric performance is exhibited since reduction of the electrical conductivity is suppressed and only thermal conductivity decreases, and a film having an adequate film strength and appropriate flexibility can be obtained.

The average particle size of the thermoelectric semiconductor microparticles is preferably from 10 nm to 200 µm, more preferably from 10 nm to 30 µm, even more preferably from 50 nm to 10 µm, and particularly preferably from 1 to 6 µm. When the average particle size is in the range above, uniform dispersion is facilitated and a high electrical conductivity can be achieved.

The method of obtaining the thermoelectric semiconductor microparticles by grinding the thermoelectric semiconductor material is not particularly limited, and grinding may be performed to a predetermined size by a known pulverizing device, such as a jet mill, a ball mill, a bead mill, a colloid mill, a conical mill, a disc mill, an edge mill, a powdering mill, a hammer mill, a pellet mill, a whirly mill, or a roller mill.

Note that, in the present specification, the average particle size of the thermoelectric semiconductor microparticles is a value that can be obtained by measurement by a laser diffraction particle analyzer (model: 1064, available from CILAS) and that is represented by the median of the particle size distribution.

Note that the thermoelectric semiconductor microparticles are preferably thermoelectric semiconductor microparticles that have undergone heat treatment in advance ("heat treatment" herein is different from "annealing" performed in the annealing process of the present invention). By performing the heat treatment, the crystallinity of the thermoelectric semiconductor microparticles is enhanced and the Seebeck coefficient (absolute value of Peltier coefficient) of the thermoelectric conversion material is increased because the surface oxidized films of the thermoelectric semiconductor microparticles are removed, and thus the thermoelectric performance index can be further enhanced. The heat treatment is not particularly limited, and the heat treatment is preferably performed in an inert gas atmosphere, such as nitrogen or argon, or a reducing gas atmosphere such as hydrogen, in which gas flow rate is controlled in a manner that the thermoelectric semiconductor microparticles are not negatively affected, or in a vacuum condition prior to preparation of the thermoelectric semiconductor composition, and is more preferably performed in a mixed gas atmosphere of an inert gas and a reducing gas. Specific temperature conditions depend on the thermoelectric semiconductor microparticles to be used; however, typically, the heat treatment is preferably performed at a temperature that is equal to or lower than the melting point of the microparticles and from 100 to 1500° C. for a few minutes to several tens of hours.

Ionic Liquid

The ionic liquid that may be contained in the thermoelectric semiconductor composition is a molten salt obtained by combining a cation and an anion and means a salt that can be present as a liquid in any temperature region in −50° C. or higher and lower than 400° C. In other words, the ionic liquid is an ionic compound having a melting point in the range of −50° C. or higher and lower than 400° C. The melting point of the ionic liquid is preferably −25° C. or higher and 200° C. or lower, and more preferably 0° C. or higher and 150° C. or lower. Because the ionic liquid has characteristics such as having a significantly low vapor pressure and being nonvolatile, having excellent thermal stability and electrochemical stability, having a low viscosity, and having a high ionic conductivity, the ionic liquid can effectively suppress reduction of the electrical conductivity between the thermoelectric semiconductor materials as a conductivity aid. Furthermore, because the ionic liquid exhibits high polarity based on the aprotic ionic structure and excellent compatibility with the heat resistant resin is achieved, the electrical conductivity of the thermoelectric conversion material can be made uniform.

As the ionic liquid, a known or commercially available ionic liquid can be used. Examples thereof include those formed from nitrogen-containing cyclic cation compounds and derivatives thereof, such as pyridinium, pyrimidinium, pyrazolium, pyrrolidinium, piperidinium, and imidazolium; tetraalkylammonium-based amine cations and derivatives thereof; phosphine cations and derivatives thereof, such as phosphonium, trialkylsulfonium, and tetraalkylphosphonium; cation components, such as lithium cation and derivatives thereof; and anion components, such as Cl$^-$, Br$^-$, I$^-$, AlCl$_4^-$, Al$_2$Cl$_7^-$, BF$_4^-$, PF$_6^-$, ClO$_4^-$, NO$_3^-$, CH$_3$COO$^-$, CF$_3$COO$^-$, CH$_3$SO$_3^-$, CF$_3$SO$_3^-$, (FSO$_2$)$_2$N$^-$, (CF$_3$SO$_2$)$_2$N$^-$, (CF$_3$SO$_2$)$_3$C$^-$, AsF$_6^-$, SbF$_6^-$, NbF$_6^-$, TaF$_6^-$, F(HF)$^-$, (CN)$_2$N$^-$, C$_4$F$_9$SO$_3^-$, (C$_2$F$_5$SO$_2$)$_2$N$^-$, C$_3$F$_7$COO$^-$, and (CF$_3$SO$_2$)(CF$_3$CO)N$^-$.

In the ionic liquid described above, from the perspective of high temperature stability, compatibility between the thermoelectric semiconductor material and the resin, suppression of reduction of the electrical conductivity between the thermoelectric semiconductor materials, and the like, the cation component of the ionic liquid preferably contains at least one type selected from the group consisting of pyridinium cations and derivatives thereof and imidazolium cations and derivatives thereof.

Specific examples of the ionic liquid in which the cation component contains the pyridinium cations and derivatives thereof include 4-methyl-butylpyridinium chloride, 3-methyl-butylpyridinium chloride, 4-methyl-hexylpyridinium chloride, 3-methyl-hexylpyridinium chloride, 4-methyl-octylpyridinium chloride, 3-methyl-octylpyridinium chloride, 3,4-dimethyl-butylpyridinium chloride, 3,5-dimethyl-butylpyridinium chloride, 4-methyl-butylpyridinium tetrafluoroborate, 4-methyl-butylpyridinium hexafluorophosphate, 1-butylpyridinium bromide, 1-butyl-4-methylpyridinium bromide, and 1-butyl-4-methylpyridinium hexafluorophosphate. Among these, 1-butyl-4-methylpyridinium bromide, 1-butylpyridinium bromide, and 1-butyl-4-methylpyridinium hexafluorophosphate are preferred.

Furthermore, specific examples of the ionic liquid in which the cation component contains the imidazolium cation and derivatives thereof include [1-butyl-3-(2-hydroxyethyl) imidazolium bromide], [1-butyl-3-(2-hydroxyethyl)imidazolium tetrafluoroborate], 1-ethyl-3-methylimidazolium chloride, 1-ethyl-3-methylimidazolium bromide, 1-butyl-3-methylimidazolium chloride, 1-hexyl-3-methylimidazolium chloride, 1-octyl-3-methylimidazolium chloride, 1-decyl-3-methylimidazolium chloride, 1-decyl-3-methylimidazolium bromide, 1-dodecyl-3-methylimidazolium chloride, 1-tetradecyl-3-methylimidazolium chloride, 1-ethyl-3-methylimidazolium tetrafluoroborate, 1-butyl-3-methylimidazolium tetrafluoroborate, 1-hexyl-3-methylimidazolium tetrafluoroborate, 1-ethyl-3-methylimidazolium hexafluorophosphate, 1-butyl-3-methylimidazolium hexafluorophosphate, 1-methyl-3-butylimidazolium methylsulfate, and 1,3-dibutylimidazolium methylsulfate. Among these, [1-butyl-3-(2-hydroxyethyl)imidazolium bromide] and [1-butyl-3-(2-hydroxyethyl)imidazolium tetrafluoroborate] are preferred.

The ionic liquid described above preferably has an electrical conductivity of $10^{-7}$ S/cm or greater. When the ionic conductivity is in the range described above, the ionic liquid can effectively suppress reduction of the electrical conductivity between the thermoelectric semiconductor materials as a conductivity aid.

Furthermore, the ionic liquid described above preferably has a decomposition temperature of 300° C. or higher. When the decomposition temperature is in the range described above, as described below, even in a case where a thin film formed from the thermoelectric semiconductor composition is subjected to annealing, effect as the conductivity aid can be maintained.

Furthermore, for the ionic liquid, the mass reduction percentage at 300° C. measured by thermogravimetry (TG) is preferably 10% or less, more preferably 5% or less, and even more preferably 1% or less. When the mass reduction percentage is in the range described above, as described below, even in a case where a thin film formed from the thermoelectric semiconductor composition is subjected to annealing, effect as the conductivity aid can be maintained.

The blended amount of the ionic liquid in the thermoelectric semiconductor composition is preferably from 0.01 to 50 mass %, more preferably from 0.5 to 30 mass %, and even more preferably from 1.0 to 20 mass %. When the blended amount of the ionic liquid is in the range described above, reduction of the electrical conductivity is effectively suppressed, and a film having a high thermoelectric performance can be obtained.

Inorganic Ionic Compound

The inorganic ionic compound that may be contained in the thermoelectric semiconductor composition is a compound formed from at least a cation and an anion. Because the inorganic ionic compound is present as a solid in a wide range of temperature region, which is from 400 to 900° C., and has characteristics such as high ionic conductivity, the inorganic ionic compound can suppress reduction of the electrical conductivity between the thermoelectric semiconductor materials as a conductivity aid.

As a cation constituting the inorganic ionic compound, a metal cation is used.

Examples of the metal cation include alkali metal cations, alkaline earth metal cations, main group metal cations, and transition metal cations. The alkali metal cations or alkaline earth metal cations are more preferred.

Examples of the alkali metal cation include $Li^+$, $Na^+$, $K^+$, $Rb^+$, $Cs^+$, and $Fr^+$.

Examples of the alkaline earth metal cation include $Mg^{2+}$, $Ca^{2+}$, $Sr^{2+}$, and $Ba^{2+}$.

Examples of the anion constituting the inorganic ionic compound include $F^-$, $Cl^-$, $Br^-$, $I^-$, $OH^-$, $CN^-$, $NO_3^-$, $NO_2^-$, $ClO^-$, $ClO_2^-$, $ClO_3^-$, $ClO_4^-$, $CrO_4^{2-}$, $HSO_4^-$, $SCN^-$, $BF_4^-$, and $PF_6^-$.

As the inorganic ionic compound contained in the thermoelectric element layer, a known or commercially available ionic liquid can be used. Examples thereof include an inorganic ionic compound formed from a cation component, such as a potassium cation, a sodium cation, or a lithium cation, and an anion component, such as chloride ions including $Cl^-$, $AlCl_4^-$, $Al_2Cl_7^-$, and $ClO_4^-$. Bromide ions including $Br^-$, iodide ions including $I^-$, fluoride ions including $BF_4$ and $PF_6$, halide anions including $F(HF)_n^-$, $NO_3^-$, $OH^-$, and $CN^-$.

In the inorganic ionic compound described above, from the perspective of high temperature stability, compatibility between the thermoelectric semiconductor material and the resin, suppression of reduction of the electrical conductivity between the thermoelectric semiconductor materials, and the like, the cation component of the inorganic ionic compound preferably contains at least one type selected from the group consisting of potassium, sodium, and lithium. Furthermore, the anion component of the inorganic ionic compound preferably contains a halide anion, and more preferably contains at least one type selected from the group consisting of $Cl^-$, $Br^-$, and $I^-$.

Specific examples of the inorganic ionic compound in which the cation component contains a potassium cation include KBr, KI, KCl, KF, KOH, and $K_2CO_3$. Among these, KBr and KI are preferred.

Specific examples of the inorganic ionic compound in which the cation component contains a sodium cation include NaBr, NaI, NaOH, NaF, and $Na_2CO_3$. Among these, NaBr and NaI are preferred.

Specific examples of the inorganic ionic compound in which the cation component contains a lithium cation include LiF, LiOH, and $LiNO_3$. Among these, LiF and LiOH are preferred.

The inorganic ionic compound preferably has an electrical conductivity of $10^{-7}$ S/cm or greater, and more preferably $10^{-6}$ S/cm or greater. When the electrical conductivity is in the range described above, the inorganic ionic compound can effectively suppress reduction of the electrical conductivity between the thermoelectric semiconductor materials as an electric conduction auxiliary agent.

Furthermore, the inorganic ionic compound described above preferably has a decomposition temperature of 400° C. or higher. When the decomposition temperature is in the range described above, as described below, even in a case where a thin film formed from the thermoelectric semiconductor composition is subjected to annealing, effect as the conductivity aid can be maintained.

Furthermore, for the inorganic ionic compound, the mass reduction percentage at 400° C. measured by thermogravimetry (TG) is preferably 10% or less, more preferably 5% or less, and even more preferably 1% or less. When the mass reduction percentage is in the range described above, as described below, even in a case where a thin film formed from the thermoelectric semiconductor composition is subjected to annealing, effect as the conductivity aid is easily maintained.

The blended amount of the inorganic ionic compound in the thermoelectric semiconductor composition is preferably from 0.01 to 50 mass %, more preferably from 0.5 to 30 mass %, and even more preferably from 1.0 to 10 mass %. When the blended amount of the inorganic ionic compound is in the range described above, reduction of the electrical conductivity is effectively suppressed and, as a result, a film having an enhanced thermoelectric performance can be obtained.

Note that, in a case where the inorganic ionic compound and the ionic liquid are used in combination, the total content of the inorganic ionic compound and the ionic liquid in the thermoelectric semiconductor composition is preferably from 0.01 to 50 mass %, more preferably from 0.5 to 30 mass %, and even more preferably from 1.0 to 10 mass %.

Resin

The thermoelectric semiconductor composition may contain a resin other than the heat resistant resin (including highly heat resistant resin described below). The resin serves as a binder between thermoelectric semiconductor materials and binds thermoelectric semiconductor materials after the coating, and makes formation of a thin film by the coating or the like easy.

The resin is appropriately selected based on the temperature of the annealing for a layer of the thermoelectric semiconductor composition in the annealing described below. The weight reduction temperature of the resin (with the resin being subjected to temperature elevation and its weight at 400° C. being defined as 100%, a temperature at which the resin undergoes a further 5% reduction in weight) is typically lower than 460° C.

The resin is not particularly limited, and a thermoplastic resin or a curable resin can be used. However, a resin that maintains various physical properties as a resin such as mechanical strength and thermal conductivity without deterioration when a thermoelectric semiconductor material undergoes crystal growth by subjecting a thin film formed from the thermoelectric semiconductor composition to, for example, the annealing is preferred.

As such a resin, a thermoplastic resin or a curable resin can be used. Examples of the thermoplastic resin include acrylic resins, such as methyl poly(meth)acrylate, ethyl poly(meth)acrylate, methyl (meth)acrylate-butyl (meth) acrylate copolymers, polyolefin resins, such as polyethylene, polypropylene, polyisobutylene, and polymethylpentene, polycarbonate resins, thermoplastic polyester resins, such as polyethylene terephthalate and polyethylene naphthalate, polystyrene, acrylonitrile-styrene copolymers, polyvinyl polymers, such as polyvinylacetate, ethylene-vinylacetate copolymers, vinyl chloride, polyvinylpyridine, poly(vinyl alcohol), and polyvinylpyrrolidone, polyurethane, and ethylcellulose. Note that methyl poly(meth)acrylate means methyl polyacrylate or methyl polymethacrylate, and this also applies to other (meth). Examples of the curable resin include thermosetting resins and photocurable resins. Examples of the thermosetting resin include epoxy resins and phenolic resins. Examples of the photocurable resin include photocurable acrylic resins, photocurable urethane resins, and photocurable epoxy resins.

Among these, a thermoplastic resin is preferred, and examples thereof include polyvinyl polymers, polyisobutylene, and poly(methyl methacrylate). Polyvinylpyrrolidone, poly(vinyl alcohol), or polystyrene is preferred, and polyvinylpyrrolidone, poly(vinyl alcohol) or polystyrene is more preferred. As the polyvinyl polymer, a water-soluble polyvinyl polymer is preferred, and examples thereof include polyvinylpyrrolidone and poly(vinyl alcohol).

Note that one type of the resin may be used alone, or a combination of multiple resins may be used.

In addition, the thermoelectric semiconductor composition may contain a highly heat resistant resin for which the weight reduction temperature (with the highly heat resistant resin being subjected to temperature elevation and its weight at 400° C. being defined as 100%, a temperature at which the resin undergoes a further 5% reduction in weight) is higher than 520° C. Examples of such a highly heat resistant resin include polyimide resins and polyamic acid, which is a precursor of the polyimide resins. Allowing the thermoelectric semiconductor composition to contain both of the heat resistant resin having the weight reduction temperature of 520° C. or lower and the highly heat resistant resin having the weight reduction temperature of higher than 520° C. makes it possible to enhance flexibility of the thermoelectric semiconductor.

Preparation method of thermoelectric semiconductor composition

The preparation method of the thermoelectric semiconductor composition is not particularly limited, and the thermoelectric semiconductor composition may be prepared by using a known device, such as an ultrasonic homogenizer, a spiral mixer, a planetary mixer, a disperser, or a hybrid mixer, and by mixing and dispersing the thermoelectric semiconductor material, the heat resistant resin, and one or both of optionally used ionic liquid and inorganic ionic compound, other additives, as well as solvent that is further added.

A solvent may be used during preparation of the thermoelectric semiconductor composition. Examples of the solvent to be used include solvents, such as toluene, ethyl acetate, methyl ethyl ketone, alcohols, tetrahydrofuran, methylpyrrolidone, and ethyl cellosolve. One type of these solvents may be used alone, or two or more types of these solvents may be mixed and used. As the solid content concentration of the thermoelectric semiconductor composition, the composition is only required to have a viscosity adequate for application, and the solid content concentration is not particularly limited.

The method for manufacturing a thermoelectric conversion body by using the thermoelectric semiconductor composition will be described below.

Thermoelectric Conversion Module

The thermoelectric conversion module according to an embodiment of the present invention has a thermoelectric conversion layer in which P-type thermoelectric elements and N-type thermoelectric elements are arranged alternately. At least one of the P-type thermoelectric element layers and the N-type thermoelectric element layers described above is any one of the thermoelectric conversion bodies described above.

The structure of the thermoelectric conversion module according to an embodiment of the present invention will be described below using drawings. The drawings are all schematic drawings, and may be exaggerated for easy understanding.

Figure 2:
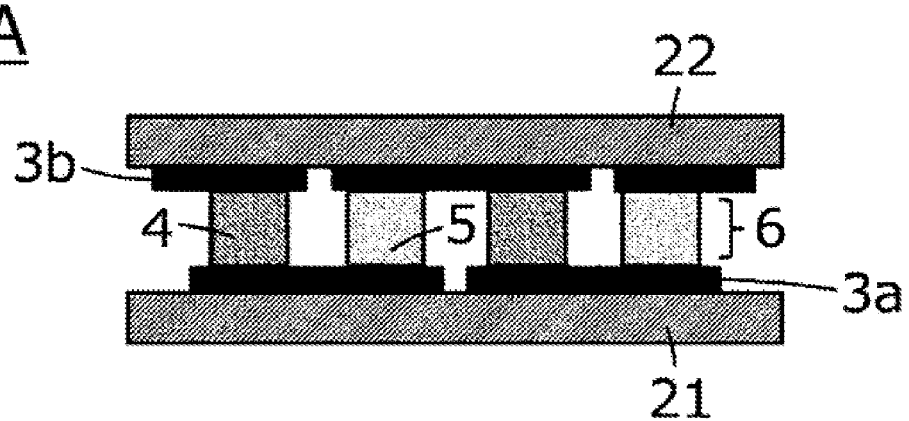
FIG. 2 is a cross-sectional schematic view illustrating an example of a thermoelectric conversion module.

FIG. 2 is a cross-sectional schematic view illustrating an example of a thermoelectric conversion module according to an embodiment of the present invention. The thermoelectric conversion module 1A illustrated in FIG. 2 is the so-called π-type thermoelectric conversion module. The thermoelectric conversion module 1A has a first substrate 21 and a second substrate 22 opposing the first substrate 21, and P-type thermoelectric element layers 5 and N-type thermoelectric element layers 4 that are arranged in between the first substrate 21 and the second substrate 22 (hereinafter, these may be collectively referred to as thermoelectric element layer 6), a first electrode 3a provided on the first substrate 21, and a second electrode 3b provided on the second substrate 22. A pair of adjacent P-type thermoelectric element layer 5 and N-type thermoelectric element layer 4 are arranged apart from each other, and for the pair of the adjacent thermoelectric element layers 4 and 5, one main surface of these layers is electrically connected to each other by the electrode 3b or the electrode 3a, and the other main surface of these layers are not electrically connected to each other. In general, because of the structure, the π-type thermoelectric conversion module is not often applied for uses that are required to have flexibility even those in sheet forms, and load on the thermoelectric conversion element is small, which is preferred.

Figure 3:
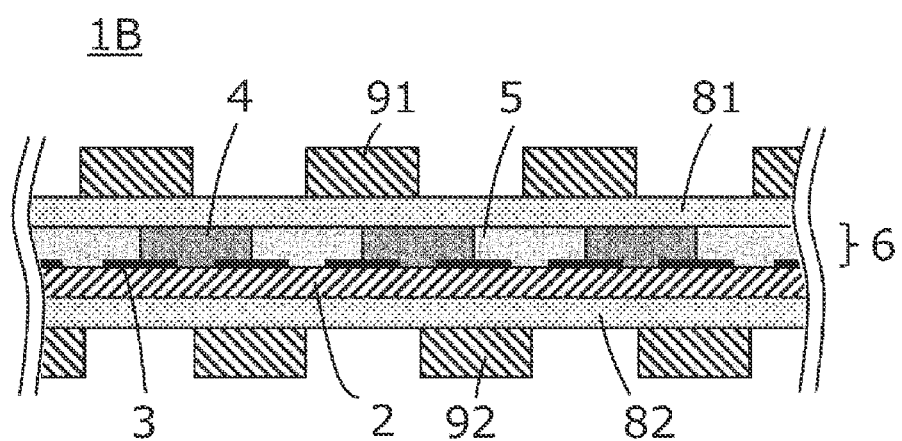
FIG. 3 is a partial cross-sectional schematic view illustrating another example of a thermoelectric conversion module.

FIG. 3 is a partial cross-sectional schematic view illustrating another example of a thermoelectric conversion module according to an embodiment of the present invention. The thermoelectric conversion module 1B illustrated in FIG. 3 is the so-called in-plane type thermoelectric conversion module. The thermoelectric conversion module 1B includes a substrate 2, a thermoelectric element layer 6 formed from P-type thermoelectric element layers 5 and N-type thermoelectric element layers 4 formed on one main surface side (the electrode 3 side of the main surface) of the substrate 2, a first covering layer 81 layered on a surface that is on the opposite side from the substrate 2 of the thermoelectric element layer 6, a first high thermal conductive layer 91 provided on a surface that is on the opposite side from the thermoelectric element layer 6 of the first covering layer 81, a second covering layer 82 layered on the other main surface of the substrate 2, and a second high thermal conductive layer 92 provided on a surface that is on the opposite side from the thermoelectric element layer 6 of the second covering layer 82.

In the thermoelectric conversion module 1A, in columns of the thermoelectric element layer, adjacent thermoelectric element layers 4 and 5 are electrically connected by electrode parts, which are electrodes 3a or electrodes 3b, and thus an energizing path is formed back and forth in between the substrate 21 and the substrate 22 along the columns of the thermoelectric element layer.

In this manner, the P-type thermoelectric element layers 5 and the N-type thermoelectric element layers 4 arranged in between the substrate 21 and the substrate 22 are electrically connected in series by the electrode parts, and as a result, the energizing path is formed back and forth in between the substrate 21 and the substrate 22.

Furthermore, also for the thermoelectric conversion module 1B, electrode parts are arranged in a manner that an electrode part is laid on a joint part of a pair of adjacent thermoelectric element layers 4 and 5 and electrical connection is formed, and thus an energizing path is formed.

Note that, in the thermoelectric conversion modules 1A and 1B, as the two-dimensional arrays of the thermoelectric element layers 4 and 5 along the main surfaces of the substrate 21 and the substrate 22, freely chosen array pattern can be employed.

In the thermoelectric conversion module 1B, on the main surface side of the substrate 2 provided with the P-type thermoelectric element layers 5 and the N-type thermoelectric element layers 4, the first high thermal conductive layers 91 are further provided in a predetermined arrangement pattern.

The first high thermal conductive layer 91 covers every other joint part of a P-type thermoelectric element layer 5 and an N-type thermoelectric element layer 4. The second high thermal conductive layer 92 is arranged at a position corresponding to a joint part of thermoelectric elements that is not covered by the first high thermal conductive layer 91 when viewed from a vertical direction with respect to the main surface of the substrate 2. As a result, in a vertical cross section in the row direction of the high thermal conductive layers 91 and 92 arranged periodically, the first high thermal conductive layer 91 and the second high thermal conductive layer 92 are arranged alternately with respect to the thermoelectric element layer 6. Note that, in the direction parallel to the main surface of the substrate 2, the edge of the first high thermal conductive layer 91 and the edge of the second high thermal conductive layer 92 may come into line or may be overlapped or separated.

The number of the electrode parts, the numbers of the P-type semiconductor layers 5 and the N-type semiconductor layers 4, and the numbers of the first high thermal conductive layers 91 and the second high thermal conductive layers 92 can be appropriately changed. Furthermore, the size and position of each of the electrode parts can be also appropriately changed.

Note that, in the thermoelectric conversion module 1B, no layers are provided in the region where the high thermal conductive layer on the covering layer is not provided; however, for example, a member such as a low thermal conductive layer may still be provided. In this case, the cover layer can also function as a fixing material of the member such as a low thermal conductive layer, in addition to a function as the high thermal conductive layer. From the perspective of enhancing the thermoelectric conversion performance of the thermoelectric conversion module, the thermal conductivity of the low thermal conductive layer is lower than the thermal conductivity of the high thermal conductive layer.

Furthermore, in a case where no layers are provided in the region where no high thermal conductive layer is provided on the covering layer and the covering layer is exposed as in the embodiment described above, the air is present in place of the low thermal conductive layer, and because the thermal conductivity of the air is extremely low, such as approximately 0.02 W/(m·K), the thermoelectric conversion performance that is equal to or greater than that of the case where a low thermal conductive layer is provided can be achieved.

Substrate

The substrate used in the thermoelectric conversion module supports, for example, the electrodes, the thermoelectric element layer, the covering layers, and the high thermal conductive layers. The following descriptions each individually apply to the substrates 2, 21, and 22 described above.

As the substrate, use of a plastic film that does not affect reduction in the electrical conductivity of the thermoelectric element layer and increase in the thermal conductivity is preferred. Among these, from the perspectives of achieving excellent flexibility, capability of maintaining performance of thermoelectric element layer without causing heat deformation of the substrate even in a case where a thin film formed from the thermoelectric semiconductor composition is subjected to annealing as described below, and achieving high heat resistance and dimensional stability, polyimide films, polyamide films, polyetherimide films, polyaramide films, and polyamide-imide films are preferred. Furthermore, from the perspective of a high versatility, polyimide films are particularly preferred.

The thickness of the film substrate, which is a substrate using a plastic film, is preferably from 1 to 1000 μm, more preferably from 5 to 500 μm, even more preferably from 10 to 500 μm, yet even more preferably from 10 to 100 μm, and particularly preferably from 20 to 100 μm, from the perspective of achieving heat resistance and dimensional stability or, in addition to this, ensuring a certain flexibility.

Furthermore, the film substrate preferably has a decomposition temperature that is equal to or higher than the annealing temperature and, for example, has a decomposition temperature of 400° C. or higher.

Furthermore, the film substrate as the substrate has the 5% weight reduction temperature measured by thermogravimetry of preferably 300° C. or higher, and more preferably 400° C. or higher. The film substrate has a dimensional change on heating measured at 200° C. in accordance with JIS K 7133(1999) of preferably 0.5% or less, and more preferably 0.3% or less. The film substrate has a linear thermal expansion coefficient in the planar direction measured in accordance with JIS K 7197(2012) of from 0.1 ppm·° $C.^{-1}$ to 50 ppm·° $C.^{-1}$, and more preferably from 0.1 ppm·° $C.^{-1}$ to 30 ppm·° $C.^{-1}$.

By using a plastic film as the substrate and forming other layers thin, it becomes easier to form the entire thermoelectric conversion module into a thin flexible sheet form.

From the perspective of suppressing entry of moisture, the water vapor transmission rate of a substrate is preferably low. The water vapor transmission rate of the substrate at 40° C. and 90% RH stipulated in JIS K 7129:2008 is preferably 200 g·$m^{-2}$·$day^{-1}$ or less, more preferably 150 g·$m^{-2}$·$day^{-1}$ or less, and even more preferably 100 g·$m^{-2}$·$day^{-1}$ or less. When the water vapor transmission rate is in this range, entry of water vapor into the thermoelectric element layer and the electrodes can be suppressed, and suppression of deterioration of the thermoelectric element layer is facilitated.

Electrode

The electrode is provided to electrically connect the P-type thermoelectric element layer and the N-type thermoelectric element layer that are constituting the thermoelectric element layer, or to electrically connect the thermoelectric element layer and outside. Various electrode materials can be used for the electrode. From the perspective of stability of the connection and thermoelectric performance, a metal material having a high electrical conductivity is preferably used. Examples of the preferred electrode material include gold, silver, nickel, copper, aluminum, rhodium, platinum, chromium, palladium, stainless steel, molybdenum, alloys containing these metals, and laminates of these metals and alloys. The electrodes 3, 3a, and 3b described above can each independently select the material described above.

In a case of the π-type thermoelectric conversion module, the thickness of the electrode is preferably from 10 nm to 200 µm, more preferably from 30 nm to 150 µm, and even more preferably from 50 nm to 120 µm. Furthermore, in a case of the in-plane type thermoelectric conversion module, the thickness of the electrode is preferably from 1 µm to 50 µm, more preferably from 2.5 µm to 30 µm, and even more preferably from 3 µm to 20 µm. When the thickness of the electrode is in the range described above, the electrical conductivity is high and resistance becomes low, and thus the total electrical resistance of the thermoelectric element layer can be suppressed to low. Furthermore, strength that is adequate as an electrode can be achieved. Furthermore, a large volume of the electrode can be achieved and, even when a metal element constituting the electrode is diffused through the thermoelectric element during use, deterioration of performance of the electrode can be suppressed. Furthermore, in a case of the in-plane type thermoelectric conversion module, the electrode is easily embedded in the thermoelectric element layer, smoothness of the surface of the thermoelectric conversion module is maintained, and thermoelectric performance tends to be stable.

Thermoelectric Element Layer

The thermoelectric element layer is formed from the thermoelectric conversion body, which is a fired product of the thermoelectric semiconductor composition containing at least the thermoelectric semiconductor material and the heat resistant resin, as described above.

The thickness of the thermoelectric element layer formed from the P-type thermoelectric element layers and the N-type thermoelectric element layers is not particularly limited, and these may have the identical thickness or different thicknesses (causing a step at the joint part). From the perspective of flexibility and raw material cost, the thicknesses of the P-type thermoelectric element and the N-type thermoelectric element are preferably from 0.1 to 100 µm, and more preferably from 1 to 50 µm.

High Thermal Conductive Layer

As illustrated in thermoelectric conversion module 1B in FIG. 3, in a case where an in-plane type thermoelectric conversion module is formed, the high thermal conductive layer is preferably provided on at least one main surface of the thermoelectric conversion layer. By providing the high thermal conductive layer, it becomes easier to efficiently provide an adequate temperature difference in a plane direction for the thermoelectric element layer inside of the thermoelectric conversion module.

As the high thermal conductive layer, a high thermal conductive layer having excellent thermal conductivity and having a thermal conductivity greater than the thermal conductivity of the covering layer is used. As the high thermal conductive layer, a high thermal conductive layer having a thermal conductivity of 5 to 500 W/(m·K) is preferably used, a high thermal conductive layer having a thermal conductivity of 15 to 420 W/(m·K) is more preferably used, and a high thermal conductive layer having a thermal conductivity of 300 to 420 W/(m·K) is even more preferably used.

The material constituting the high thermal conductive layer is not particularly limited as long as the material has a large thermal conductivity and is preferably a metal, more preferably one type selected from copper, aluminum, silver, or nickel, even more preferably one type selected from copper, aluminum, or silver, and yet even more preferably one type selected from copper or aluminum.

The high thermal conductive layer is arranged in a pattern, such as stripe, grid-like, honeycomb-like, comb-like, or matrix-like. By this, it becomes easier to cause a temperature difference in a plane direction of the thermoelectric conversion module and, by allowing the boundary part between the P-type thermoelectric element layer and the N-type thermoelectric element layer to be exposed, heat exchange from the outside is efficiently performed. As a result, electromotive force performance, exothermic performance, and endothermic performance of the thermoelectric conversion module can be enhanced.

As described above, it is preferable to arrange a first high thermal conductive layer on one surface side of the thermoelectric element layer in a manner that every other joint part between a P-type thermoelectric element layer and an N-type thermoelectric element layer is covered, and to arrange a second high thermal conductive layer at a position corresponding to a joint part of the thermoelectric elements that is not covered by the first high thermal conductive layer when viewed from a direction that is vertical with respect to a main surface of the substrate, in a manner that the first high thermal conductive layer and the second high thermal conductive layer are alternately arranged with respect to the thermoelectric element layer in a vertical cross section in the row direction of the high thermal conductive layers.

The thickness of the high thermal conductive layer is preferably from 40 to 550 µm, more preferably from 60 to 530 µm, and even more preferably from 80 to 510 µm, from the perspectives of flexibility, radiation performance, and dimensional stability. In a case where two high thermal conductive layers, which are a first high thermal conductive layer 91 and a second high thermal conductive layer 92, are provided, these may be of the identical material or different materials, and these may have the identical thickness or different thicknesses.

Other Layer

The thermoelectric conversion module may have another layer as necessary. For example, the thermoelectric element layer may be protected by arranging a covering layer formed from a single layer or multiple layers in a manner that the covering layer covers the thermoelectric element layer on at least one main surface.

Furthermore, the covering layer may contain a sealing layer. In a case where the covering layer is a single layer, the covering layer itself can serve as both covering layer and sealing layer. In a case where the covering layer is formed from multiple layers, a sealing layer may be contained in any one of the layers. In a case where the covering layer contains a sealing layer, permeation of water vapor in the air can be further effectively suppressed, and long-term maintenance of the performance of the thermoelectric conversion module is facilitated.

The covering layer may contain a layer having adhesiveness (adhesive layer). In the present specification, "adhesiveness" include both adhesiveness and pressure-sensitive adhesiveness, which is being capable of adhesion by pressure sensitivity in an early stage of pasting. Examples of the adhesiveness other than the pressure-sensitive adhesiveness include humidity-sensitive adhesiveness and adhesiveness by heat melting. The adhesive layer preferably contains a composition having adhesiveness (hereinafter, also referred to as "adhesive composition"). Examples of the preferred resin component contained in the adhesive composition include polyolefin resins, epoxy resins, and acrylic resins. By allowing the covering layer to contain the adhesive layer, covering of the high thermal conductive layer and the thermoelectric element layer is facilitated. Note that, in a case where the covering layer is a single layer, the covering layer itself can serve as both covering layer and sealing layer.

The covering layer may contain a supplemental substrate layer. The supplemental substrate layer serves as a substrate to support an adhesive layer or a sealing layer in a case where the covering layer contains the sealing layer or the adhesive layer. By allowing the covering layer to contain the supplemental substrate layer, adjustment of the thermal conductivity of the entire covering layer can be facilitated, and the strength of the entire thermoelectric conversion module can be enhanced. Furthermore, in a case where the high thermal conductive layer is electrically conductive, by allowing the presence of the supplemental substrate layer in between the high thermal conductive layer and the thermoelectric element layer, a short circuit between the high thermal conductive layer and the thermoelectric element layer can be prevented.

Figure 4:
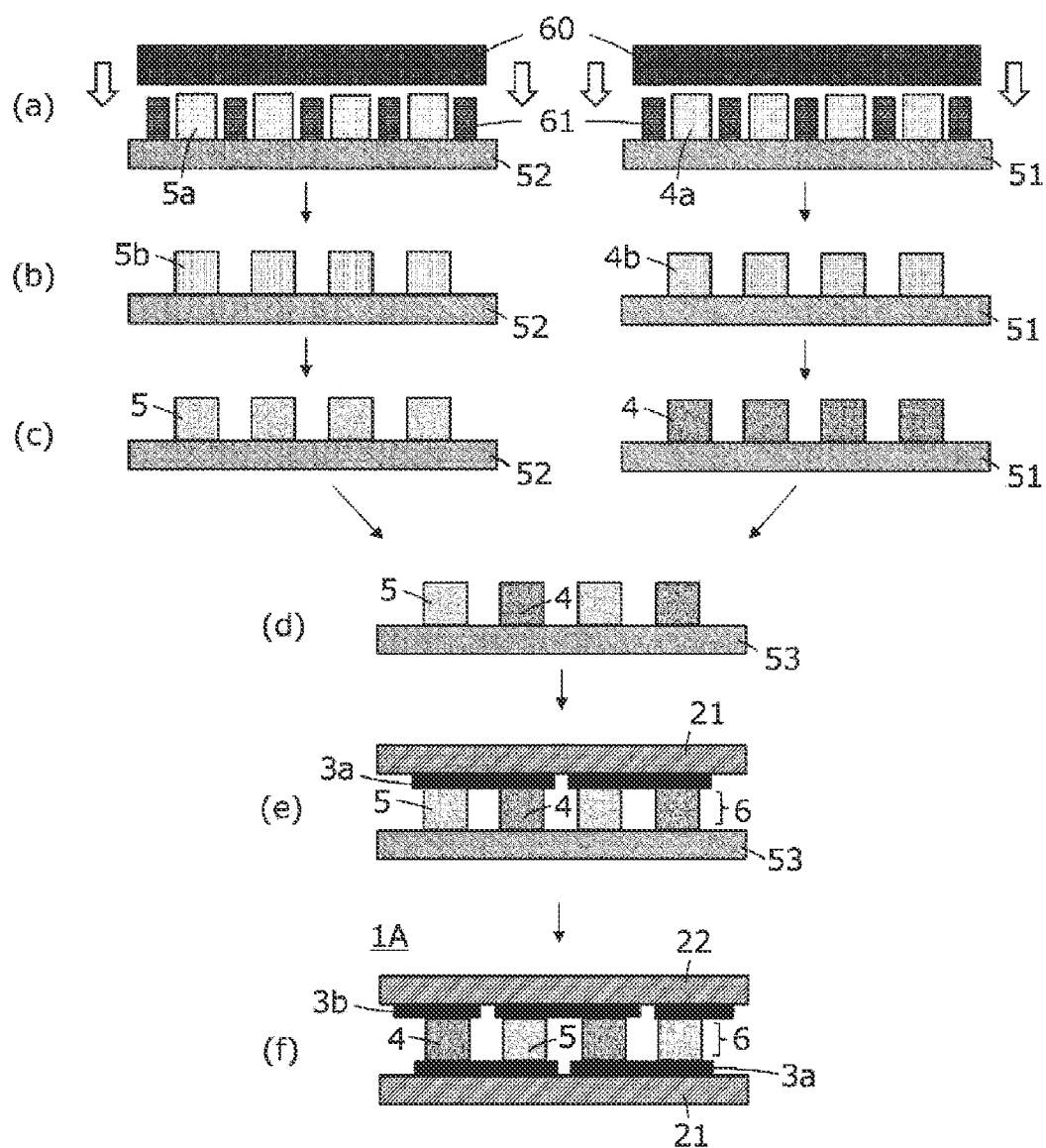
FIG. 4 is schematic views illustrating an example of a method for manufacturing a thermoelectric conversion body and a thermoelectric conversion module.

Method for manufacturing thermoelectric conversion body and thermoelectric conversion module FIG. 4 is schematic views illustrating an example of a method for manufacturing a thermoelectric conversion body and a thermoelectric conversion module. Among these, FIG. 4(a) to FIG. 4(c) are schematic views illustrating an example of a method for manufacturing a thermoelectric conversion body, and FIG. 4(c) to FIG. 4(f) are schematic views illustrating an example of a method for manufacturing a thermoelectric conversion module 1A, which is a π-type thermoelectric conversion module.

Hereinafter, to facilitate understanding, the method for manufacturing a thermoelectric conversion body and the method for manufacturing a thermoelectric conversion module according to the present embodiment are described by using these drawings; however, the present invention is not limited to the embodiment illustrated in these drawings.

Method for Manufacturing Thermoelectric Conversion Body

The method for manufacturing the thermoelectric conversion body according to an embodiment of the present invention includes: coating a support with the thermoelectric semiconductor composition on, forming a coating film by drying the thermoelectric semiconductor composition coating the support, and forming the thermoelectric conversion body, which is a fired product of the composition containing the thermoelectric semiconductor material and the heat resistant resin, by subjecting the coating film to annealing.

Preferably, the coating film obtained by drying is pressed, then the pressed coating film is subjected to annealing, and thus a thermoelectric conversion body is formed. By subjecting the coating film to pressing, the thermoelectric semiconductor material is closely arranged, and it becomes advantageous for enhancing electrical conductivity.

Example of Method for Manufacturing Thermoelectric Conversion Body

An example of method for manufacturing a thermoelectric conversion body used in a thermoelectric conversion layer of a thermoelectric conversion module 1A illustrated in FIG. 2 is described below. The manufacturing method for the present example includes a step of forming coating films of P-type and N-type thermoelectric semiconductor materials on supports and a step of forming a thermoelectric conversion body by subjecting the coating films to annealing.

FIG. 4(a) to FIG. 4(c) are explanation drawings illustrating an example of the method for manufacturing a thermoelectric conversion body. FIG. 4(a) is a drawing illustrating pressing of the coating film 5a and the coating film 4a formed by coating and drying on the supports 52 and 51, FIG. 4(b) is a drawing illustrating the P-type parts 5b after the pressing and the N-type parts 4b after the pressing, and FIG. 4(c) is a drawing illustrating thermoelectric conversion bodies 5 and 4 obtained by performing the annealing.

In this example, first, as illustrated in FIG. 4(a), the thermoelectric semiconductor composition containing the N-type thermoelectric semiconductor material is arranged on a support 51 in a predetermined array pattern and coated and dried to form a coating film 4a. Furthermore, the thermoelectric semiconductor composition containing the P-type thermoelectric semiconductor material is arranged on a support 52 in a predetermined array pattern and coated and dried to form a coating film 5a.

Support

Examples of the supports 51 and 52 include glass, silicon, ceramic, metals, and plastics. From the perspective of performing annealing at a high temperature, glass, silicon, ceramic, and metals are preferred. From the perspectives of adhesion to the thermoelectric conversion material, raw material cost, and dimensional stability after the heat treatment, use of glass, silicon, or ceramic is more preferred.

The thickness of the support may be from 100 to 10000 μm from the perspectives of process and dimensional stability.

Pressing

For the coating film 5a and the coating film 4a formed by coating and drying, as necessary, pressing is performed by pressing each of them by a pressing member 60. When pressing is performed, as illustrated in FIG. 4(a), the coating films 5a and 4a are more easily maintained in an intended shape by pressing the coating films 5a and 4a in a condition where frame members 61 are arranged in a manner that the frame members 61 surround each of the coating films 5a and 4a.

As an embodiment, the pressing is preferably performed in an atmosphere at the atmospheric pressure after the layers of the thermoelectric semiconductor compositions after drying are cooled to room temperature. Furthermore, as another embodiment, the pressing may be performed without cooling to room temperature of the layers of the thermoelectric semiconductor compositions after drying and while the drying temperature is maintained, and then the layers may be fed to the annealing step, which is the next step described below.

Examples of the pressing method include methods that use physical pressurizing means, such as a hydraulic press, vacuum press, or weight. The amount of pressurization varies based on, for example, the viscosity of the thermoelectric conversion material layer and the amount of voids and is typically from 0.1 to 80 Mpa, preferably from 1.0 to 60 Mpa, more preferably from 5 to 50 Mpa, and even more preferably from 10 to 42 Mpa, from the perspectives of allowing the thermoelectric semiconductor material to be adequately dense and preventing deformation of the coating film or damage of the thermoelectric semiconductor material due to an excessive pressing force. Note that the pressurization may be performed by increasing the pressure to the predetermined amount of pressurization at once; however, from the perspectives of maintaining the shape stability of the thermoelectric conversion material layer and enhancing the filling rate of the thermoelectric conversion material by reducing more voids in the thermoelectric conversion material layer, although it is appropriately adjusted, the amount of pressurization is increased to the predetermined amount of pressurization typically at from 0.1 to 50 Mpa/min, preferably from 0.5 to 30 Mpa/min, and even more preferably from 1.0 to 10 Mpa/min.

The pressing time varies based on the pressing method and is typically from 5 seconds to 5 hours, preferably from 30 seconds to 3 hours, more preferably from 5 minutes to 2 hours, and even more preferably from 10 minutes to 1 hour.

When the amount of pressurization and the pressing time are in these ranges, the filling rate is increased, and the enhancement of the electrical conductivity of the thermoelectric conversion body after the annealing is facilitated.

Note that, in the example illustrated in FIG. 4, both of the coating film 5a of the thermoelectric semiconductor composition containing the P-type thermoelectric semiconductor material and the coating film 4a of the thermoelectric semiconductor composition containing the N-type thermoelectric semiconductor material are subjected to the pressing; however, it is not limited to these. For example, only one of the coating films 5a and 4a may be subjected to the pressing, and when the pressing is unnecessary, the pressing may be omitted.

Then, the P-type part 5b and the N-type part 4b of the coating films of the thermoelectric semiconductor compositions containing the thermoelectric semiconductor materials, which are pressed, (in a case where no pressing is performed, the coating films 5a and 4a before drying) are each subjected to annealing, and thus a thermoelectric conversion body which is a fired product of the thermoelectric semiconductor compositions is obtained.

Annealing

The annealing of the coating film stabilizes the thermoelectric performance of the thermoelectric conversion body obtained after the annealing and further enhances the thermoelectric performance by allowing the crystal growth of the thermoelectric semiconductor material in the coating film. The process or treatment conditions of the annealing of the coating film are not particularly limited but the annealing is typically performed in an inert gas atmosphere, such as nitrogen or argon, or a reducing gas atmosphere, in which gas flow rate is controlled, or in a vacuum condition.

The annealing temperature of the coating film is preferably a temperature that is 30° C. or more lower than the weight reduction temperature of the heat resistant resin (with the heat resistant resin being subjected to temperature elevation and its weight at 400° C. being defined as 100%, the temperature at which the heat resistant resin undergoes a further 5% reduction in weight), and more preferably a temperature that is 35° C. or more lower than the weight reduction temperature of the heat resistant resin, and preferably a temperature that is 30 to 110° C. lower than the weight reduction temperature of the heat resistant resin, and more preferably a temperature that is 35 to 100° C. lower than the weight reduction temperature of the heat resistant resin. Specifically, the annealing is performed by placing the support, on which the coating film is formed, in an atmosphere at a temperature of preferably 260° C. or higher and lower than 460° C., and more preferably from 280 to 455° C., preferably for a several minutes to several tens of hours, and more preferably for several minutes to several hours. By performing the annealing of the coating film at a temperature lower than the weight reduction temperature of the heat resistant resin by at least a predetermined degree of temperature or more, the rate of decomposition and disappearance of the heat resistant resin during the annealing is mitigated, and the toughness of the thermoelectric conversion body obtained after the annealing is easily maintained.

In an embodiment of the method for manufacturing the thermoelectric conversion body, for example, as illustrated in FIG. 4(d) below, to arrange two types of
  chip-like thermoelectric conversion bodies on a support in a predetermined array, a step of releasing the thermoelectric conversion bodies from the supports after the annealing is included. In this case, to facilitate release of the thermoelectric conversion bodies from the supports,
  as described below, the thermoelectric conversion bodies 4 and 5 are released from the supports 51 and 52 after the annealing. Thus, to facilitate the release, sacrificial layers may be provided on surfaces of the supports 51 and 52.

Sacrificial Layer

The sacrificial layer is provided in between a support and a coating film of a thermoelectric semiconductor composition and is a layer having a function to release the thermoelectric conversion body from the support after the annealing of the coating film. The sacrificial layer may be disappeared or present after the annealing, the characteristics of the thermoelectric conversion body is not affected as a result, and a function that can release a thermoelectric conversion body is only required. The sacrificial layer is preferably a layer formed from a resin also having these functions and/or a release agent.

As described below, the thermoelectric conversion bodies 4 and 5 released from the supports 51 and 52 are arranged in a manner that P-type thermoelectric conversion bodies and N-type thermoelectric conversion bodies are in a predetermined order and interval on one support to produce a thermoelectric conversion module.

Example of method for manufacturing thermoelectric conversion module

Next, with reference to FIG. 4(c) to FIG. 4(f), an example of the method for manufacturing a thermoelectric conversion module 1A is described.

FIG. 4(c) to FIG. 4(f) are drawings that explain an example of the method for manufacturing a thermoelectric conversion module according to the present embodiment. FIG. 4(c) is as described above. FIG. 4(d) is a drawing illustrating a state where chip-like thermoelectric conversion bodies are arranged in a predetermined order and a predetermined pattern on a support 53. FIG. 4(e) is a drawing illustrating a state after the substrate 21 is laminated in a manner that an electrode 3a formed on the substrate 21 is in contact with one surface of each of the thermoelectric conversion bodies 4 and 5. FIG. 4(f) is a drawing illustrating a state after the substrate 21 is laminated in a manner that an electrode 3b formed on the substrate 22 is in contact with the other surfaces, which are exposed after the removal of the support 53, of the thermoelectric conversion bodies 4 and 5.

First, each of chip-like thermoelectric conversion bodies 4 and thermoelectric conversion bodies 5 obtained in FIG. 4(c) are removed from the supports 51 and 52, and are alternately arranged on the support 53 according to the predetermined array pattern as illustrated in FIG. 4(d).

As the method of arranging a plurality of the thermoelectric conversion bodies 4 and a plurality of the thermoelectric conversion bodies 5 on an electrode, a known method can be employed, such as arranging by handling each chip-like thermoelectric conversion body by a robot arm or the like and adjusting the position by a microscope or the like.

As the support 53, those identical to the supports 51 and 52 described above can be used. Furthermore, the support 53 may have a pressure sensitive adhesive layer on a surface to which the thermoelectric conversion bodies 4 and 5 are mounted. By using a support having a pressure sensitive adhesive layer on a surface, the thermoelectric conversion bodies 4 and 5 can be reliably maintained at a predetermined position.

Then, a first substrate 21 having first electrodes 3a formed on the surface in a predetermined pattern is prepared, and as illustrated in FIG. 4(e), the first substrate 21 is bonded to the surface of the thermoelectric conversion bodies 4 and the thermoelectric conversion bodies 5 by using an electrically conductive bonding material, such as solder.

In a case where the electrode is formed on the first substrate 21, for example, a method by which the electrode 3a is formed by forming a metal layer on a resin film as a substrate and, as necessary, further processing the metal layer into a predetermined pattern can be used.

For details, examples thereof include a method in which, after an electrode layer on which any pattern is not formed by various dry process or wet process is provided on a resin film, processing into a predetermined pattern shape is performed by a known physical treatment mainly using a photolithography method or chemical treatment or a combination of these, or a method by which a pattern of the electrode is directly formed by a screen printing method or an inkjet method.

The step of bonding the electrode 3a and the thermoelectric conversion bodies 4 and 5 can employ, for example, the following method. First, a bonding material layer, such as solder, is provided on an electrode 3a of a substrate 21 and, as needed, receiving layers that can receive solder or the like are provided on one surface of the thermoelectric conversion bodies 4 and 5. After the bonding material layer and the thermoelectric conversion bodies 4 and 5, or the receiving layers are layered, the bonding material layer is heated to a predetermined temperature and maintained for a predetermined time. By returning the temperature to room temperature, the thermoelectric conversion bodies 4 and 5 are bonded to the electrode 3a by interposing the bonding material layer therebetween or interposing the bonding material layer and the receiving layer therebetween.

Examples of the bonding material constituting the bonding material layer 1 include solder materials, electrically conductive adhesives, and sinter bonding agents, and these are preferably formed into a solder layer, an electrically conductive adhesive layer, or a sinter bonding layer on an electrode.

Among these, the solder materials can be selected from alloys that are used as known solder. Examples of the method of coating a substrate with the solder material include known methods such as stencil printing, screen printing, and dispensing methods. The heating temperature varies based on, for example, the solder material and the resin film but is typically from 150 to 280° C. Heating is preferably performed for 3 to 20 minutes.

In a case where a solder layer is used, from the perspective of enhancing adhesion to the chip of the thermoelectric conversion material, bonding is preferably performed by interposing a solder receiving layer described below.

The solder receiving layer preferably contains a metal material. The metal material is preferably at least one type selected from the group consisting of gold, silver, aluminum, rhodium, platinum, chromium, palladium, tin, and alloys containing these metal materials. Among these, the metal material is more preferably gold, silver, aluminum, or a two layer structure of tin and gold; and from the perspectives of material cost, high thermal conductivity, and bonding stability, silver and aluminum are more preferred.

For the solder receiving layer, a solder receiving layer formed by a screen printing method, a stencil printing method, an electroplating method, an electroless plating method, or a vacuum film deposition method is preferably provided on the thermoelectric element.

Then, the thermoelectric conversion body 4 and the thermoelectric conversion body 5 are separated from the support 53 and, on a second electrode 3b of the second substrate 22 having the second electrode 3b formed with a predetermined pattern on the surface, the second substrate 22 being prepared in advance, the other surfaces of the thermoelectric conversion body 4 and the thermoelectric conversion body 5 are bonded by using an electrically conductive bonding material, such as solder. Thus, a thermoelectric conversion module 1A is obtained.

The forming method and materials of the electrode 3b of the substrate 22 are identical to those described for the electrode 3a of the substrate 21. Furthermore, the bonding method and the bonding material of the electrode 3b and the thermoelectric conversion bodies 4 and 5 are identical to those described for the electrode 3a.

The example of the method for manufacturing the thermoelectric conversion module described above is advantageous in that, because the N-type thermoelectric conversion body and the P-type thermoelectric conversion body are separately prepared, the manufacturing conditions that are appropriate for each of the N-type thermoelectric conversion body or the P-type thermoelectric conversion body can be selected. For example, only one of the N-type or P-type thermoelectric conversion body can be subjected to pressing, or pressing conditions of the N-type and P-type thermoelectric conversion bodies can be varied.

However, the method for manufacturing the thermoelectric conversion module 1A is not limited to the example described above, and a method for simultaneously manufacturing the P-type and N-type thermoelectric conversion bodies on one support may be also employed. Furthermore, for a substrate with an electrode used for a thermoelectric conversion module, a thermoelectric conversion body may be formed in contact with the electrode, and thus a thermoelectric conversion module may be prepared without release from the substrate.

EXAMPLES

Next, specific examples according to an embodiment of the present invention are described; however, the present invention is not limited to these examples. Note that the average particle size of the thermoelectric semiconductor microparticles and the weight reduction temperature (with the heat resistant resin being subjected to temperature elevation and its weight at 400° C. being defined as 100%, a temperature at which the heat resistant resin undergoes a further 5% reduction in weight) of the heat resistant resin that were used in Examples and Comparative Examples described below were measured by the following procedure.
Average Particle Size The average particle size of the thermoelectric semiconductor microparticles was measured by measuring particle size distribution of the thermoelectric semiconductor microparticles by a laser diffraction particle analyzer (Mastersizer 3000, available from Malvern).

Weight Reduction Temperature Of Heat Resistant Resin

The weight reduction temperature of the heat resistant resin was obtained by performing thermogravimetry in the conditions described above by using a thermogravimetric analyzer DTG-60 (available from Shimadzu Corporation).

Production of Thermoelectric Semiconductor Microparticles

P-type bismuth telluride $Bi_{0.4}Te_{3.0}Sb_{1.6}$, which is a bismuth-tellurium-based thermoelectric semiconductor material, (available from Kojundo Chemical Lab. Co., Ltd.; particle size: 180 μm) was pulverized in a nitrogen gas atmosphere by using a planetary ball mill (Premium Line P-7, available from Fritsch Japan Co., Ltd.), and thus thermoelectric semiconductor microparticles T1 having an average particle size of 2.0 μm were produced.

Furthermore, N-type bismuth telluride $Bi_2Te_3$, which is a bismuth-tellurium-based thermoelectric semiconductor material, (available from Kojundo Chemical Lab. Co., Ltd.; particle size: 180 μm) was pulverized in the same manner as described above, and thus thermoelectric semiconductor microparticles T2 having an average particle size of 2.5 μm were produced.

Preparation of Thermoelectric Semiconductor Compositions 1 to 4

A thermoelectric semiconductor composition 1 was prepared by mixing and dispersing 72.0 parts by mass of the obtained P-type bismuth-tellurium-based thermoelectric semiconductor material microparticles T1, 15.5 parts by mass of polyamide-imide solution (product name COMPOCERAN AI301, available from Arakawa Chemical Industries, Ltd.; solvent: N-methylpyrrolidone; solid content concentration: 19 mass %) as a heat resistant resin, and 12.5 parts by mass of N-butylpyridinium bromide (1-butylpyridinium bromide) as an ionic liquid. Note that the value of part by mass is an amount including mass of a solvent in a case where a raw material contains the solvent, and the same applies hereinafter.

Furthermore, a thermoelectric semiconductor composition 2 was prepared by mixing and dispersing 75.7 parts by mass of the obtained N-type bismuth-tellurium-based thermoelectric semiconductor material microparticles T2, 16.3 parts by mass of polyamide-imide solution (product name COMPOCERAN AI301, available from Arakawa Chemical Industries, Ltd.; solvent: N-methylpyrrolidone; solid content concentration: 19 mass %) as a heat resistant resin, and 8 parts by mass of N-butylpyridinium bromide (1-butylpyridinium bromide) as an ionic liquid.

Furthermore, a thermoelectric semiconductor composition 3 was prepared by mixing and dispersing 72 parts by mass of the P-type bismuth-tellurium-based thermoelectric semiconductor material microparticles T1 described above, 15.5 parts by mass of polyamic acid (poly(pyromellitic dianhydride-co-4,4'-oxydianiline) amic acid solution, available from Sigma-Aldrich; solvent: N-methylpyrrolidone; solid content concentration: 18 mass %) which is a polyimide precursor as a heat resistant resin, and 12.5 parts by mass of N-butylpyridinium bromide as an ionic liquid.

Furthermore, a thermoelectric semiconductor composition 4 was prepared by mixing and dispersing 75.7 parts by mass of the N-type bismuth-tellurium-based thermoelectric semiconductor material microparticles T2 described above, 16.3 parts by mass of polyamic acid (poly(pyromellitic dianhydride-co-4,4'-oxydianiline) amic acid solution, available from Sigma-Aldrich; solvent: N-methylpyrrolidone; solid content concentration: 18 mass %) which is a polyimide precursor as a heat resistant resin, and 8.0 parts by mass of N-butylpyridinium bromide as an ionic liquid.

Example 1

A glass substrate having a thickness of 0.7 mm was coated with the thermoelectric semiconductor composition 1 on the surface by using an applicator and heated and dried at 120° C. for 10 minutes, and thus a coating film having an area of approximately 100 cm² was formed. This coating film was cut into 5×15 mm and heat-treated at an annealing temperature of 450° C. for 30 minutes in an argon-hydrogen mixed gas atmosphere, and thus a test piece of the thermoelectric conversion body was obtained.

Example 2

A test piece of the thermoelectric conversion body was prepared in the same manner as in Example 1 except for using the thermoelectric semiconductor composition 2 and changing the annealing temperature to 400° C.

Example 3

For formation of a coating film, a test piece of the thermoelectric conversion body was prepared by using a method in which, using a metal mask provided with openings in a pattern, the thermoelectric semiconductor composition 2 was flow-cast on the metal mask, and the thermoelectric semiconductor composition that was not filled in the opening was removed by a squeegee, and heat-drying was performed at 125° C. for 10 minutes. As the metal mask, a metal mask having an opening of 1.95 mm×1.95 mm and a thickness of 340 μm corresponding to the shape of the chip-like thermoelectric conversion body to be prepared was used. Followed by the coating of the composition and drying, the dried coating film was removed from the metal mask and subjected to annealing in the conditions identical to those of Example 2, and thus a test piece of the chip-like thermoelectric conversion body was prepared.

Example 4

A test piece of the chip-like thermoelectric conversion body was prepared in the same manner as in Example 3 except for performing pressing on the dried coating film. The pressing was performed at room temperature in the air atmosphere by using a hydraulic press at a pressure, displayed on a pressure gauge, of 30 MPa. Furthermore, to prevent deformation of the coating film by the pressurization, a frame having openings corresponding to the target chip shape was arranged in a manner that the coating film was surrounded by the frame, and then the coating film was pressed.

Comparative Example 1

A test piece of the thermoelectric conversion body was prepared in the same manner as in Example 1 except for using the thermoelectric semiconductor composition 3.

Comparative Example 2

A test piece of the thermoelectric conversion body was prepared in the same manner as in Example 2 except for using the thermoelectric semiconductor composition 4.

Thickness of Thermoelectric Conversion Body

The thickness of the thermoelectric conversion body produced in each of Examples 1 to 4 and Comparative Examples 1 and 2 was measured by a constant pressure thickness gauge, available from TECLOCK Co., Ltd., and used as the thickness of the thermoelectric conversion body. The results are shown in Table 1.

Measurement of Electrical Conductivity

The electrical conductivity of the test piece of each of Examples 1 and 2 and Comparative Examples 1 and 2 was measured by using a thermoelectric characteristic analyzer ZEM-3, available from Advance Riko, Inc.

Furthermore, for the test piece of each of Examples 3 and 4, taking its small size into consideration, electric resistance was measured by using an ohmmeter RM3545, available from Hioki E.E. Corporation, by four-terminal sensing with a distance between the terminals of 1.2 mm, and the electrical conductivity was determined by calculation. The results are shown in Table 1.

Filling Rate

For each of the test pieces of Examples 3 and 4, a vertical cross section including a central part of the thermoelectric conversion material layer was cut by using a polishing device (model: Refine Polisher HV, available from Refine Tec Ltd.). Note that, to prevent damage to the cross section, the polishing device was equipped with an aluminum buff. By using FE-SEM/EDX (FE-SEM: model: S-4700, available from Hitachi High-Tech Corporation) as a scanning electron microscope (SEM), the vertical cross section was observed. Then, using Image J (image processing software, ver. 1.44P), the filling rate defined by the proportion of the area occupied by the thermoelectric semiconductor composition in the area of the vertical cross section of the thermoelectric conversion material layer was calculated.

In the measurement of the filling rate, using an SEM image with the magnification of 500 times (vertical cross section), as an image, the measurement range was trimmed for a range surrounded by 1280 pixel in the width direction and 220 pixel in the thickness direction with respect to the boundary between the thermoelectric conversion material layer and the alumina substrate. The trimmed image was subjected to binarization processing by maximizing the contrast by "Brightness/Contrast" and, taking the dark part obtained by the binarization processing as the void part and taking the light part as the thermoelectric semiconductor composition, the filling rate of the thermoelectric semiconductor composition was calculated by "Threshold". Note that, because a part that was made white due to attached aluminum particles of the aluminum buff was observed, in the calculation of the filling rate described above, correction was performed by subtracting the area of the voids covered by the aluminum particles from the area of the thermoelectric semiconductor composition described above. Specifically, the contrast was set to a numerical value that made it possible to distinguish the whitened part and the other part by "Brightness/Contrast", binarization processing was performed, and the light part by the binarization processing was taken as the part covered by the aluminum particles and this was all taken as voids. The filling rate was calculated for three SEM images, and an average value thereof was used.

Figure 5:
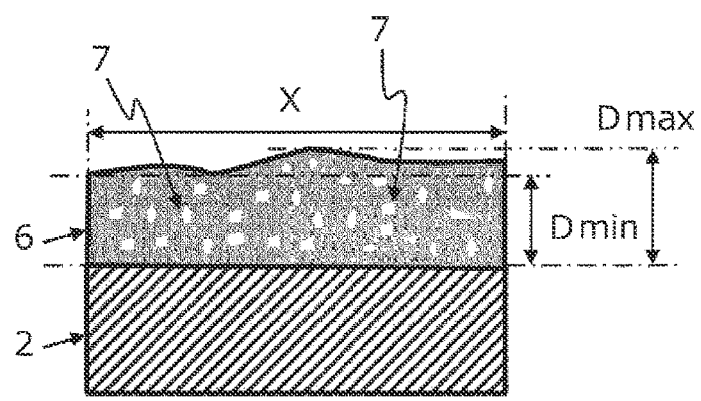
FIG. 5 is a cross-sectional schematic view to explain a procedure for measuring a filling rate of a thermoelectric conversion body.

Note that the trimmed image was selected within the region of the vertical cross section and, for example, in a case where the top part of the vertical cross section of the central part of the thermoelectric conversion body includes recess parts and protrusion parts and includes the vertical cross section formed from a curve having Dmin and Dmax in the thickness direction like the thermoelectric conversion body 2 illustrated in FIG. 5, a region that does not exceed X in the width direction and Dmin in the thickness direction of the vertical cross section was selected so that the void part surrounding the thermoelectric conversion body (air layer portion) is not included. Note that Dmin means a minimum value of the thickness in the thickness direction of the vertical cross section, and Dmax means a maximum value of the thickness in the thickness direction of the vertical cross section.

Warpage

Figure 6:
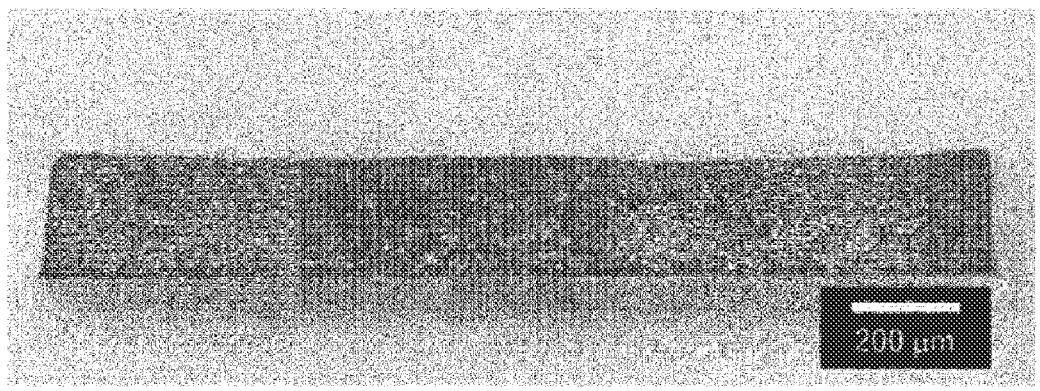
FIG. 6 is a photograph of a vertical cross section of a thermoelectric conversion body of Example 3.
Figure 7:
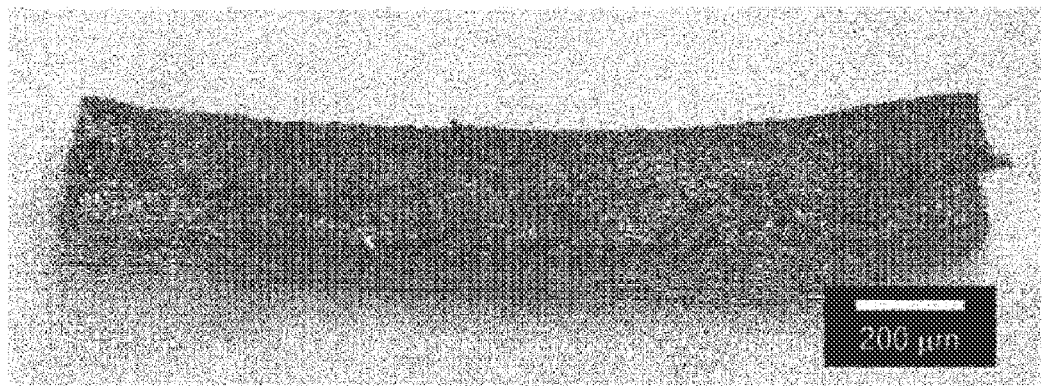
FIG. 7 is a photograph of a vertical cross section of a thermoelectric conversion body of a test piece prepared for reference.

Using a test piece of Example 3 having the largest thickness among the obtained test pieces, a side of the test piece was observed by using a digital microscope VHX-5000, available from Keyence Corporation, and presence of warpage was checked. FIG. 6 is a photograph of Example 3, and FIG. 7 is a photograph of a test piece prepared by the same production method as that of the test piece of Example 3 but by using the thermoelectric semiconductor composition 4 for reference. It was found that almost no warpage occurred in Example 3 shown in FIG. 6 while remarkable warpage occurred in the test piece shown in FIG. 7.

TABLE 1

| | Thermoelectric semiconductor material | Binder resin Material | Binder resin Blended amount [mass %] | Binder resin Weight reduction temperature [° C.] | Annealing temperature [° C.] | Thickness [μm] | Filling rate [%] | Electrical conductivity [S/cm] |
|---|---|---|---|---|---|---|---|---|
| Example 1 | P-type $Bi_{0.4}Te_3Sb_{1.6}$ | Polyamide-imide | 2.7 | 490 | 450 | 10 | — | 202 |
| Example 2 | N-type $Bi_2Te_3$ | Polyamide-imide | 3.0 | 490 | 400 | 32 | — | 52 |
| Example 3 | N-type $Bi_2Te_3$ | Polyamide-imide | 3.0 | 490 | 400 | 237 | 77 | 211 |
| Example 4 | N-type $Bi_2Te_3$ | Polyamide-imide | 3.0 | 490 | 400 | 205 | 83 | 379 |
| Comparative Example 1 | P-type $Bi_{0.4}Te_3Sb_{1.6}$ | Polyimide | 2.7 | greater than 550 | 450 | 10 | — | 125 |
| Comparative Example 2 | N-type $Bi_2Te_3$ | Polyimide | 3.0 | greater than 550 | 400 | 40 | — | 35 |

As is clear from the results in Table 1, the test piece of Example 1, which was a P-type thermoelectric conversion body, had a higher electrical conductivity compared to that of the test piece of Comparative Example 1, which was a P-type thermoelectric conversion body. Furthermore, the test piece of Example 2, which was an N-type thermoelectric conversion body, had a higher electrical conductivity compared to that of the test piece of Comparative Example 2, which was an N-type thermoelectric conversion body. From these, it was understood that the electrical conductivity can be enhanced by using a heat resistant resin having a weight reduction temperature of 520° C. or lower.

In particular, it was found that the test piece of Example 4, which had the filling rate of 80% or greater, had an even larger value of the electrical conductivity.

Furthermore, since the chip-like thermoelectric conversion body of Example 3 had a larger thickness compared to those of Examples 1 and 2, the chip-like thermoelectric conversion body was more disadvantageous than Examples 1 and 2 from the perspective of occurrence of warpage, but occurrence of warpage was not particularly observed. On the other hand, in the chip-like thermoelectric conversion body which was a test piece prepared for reference, warpage occurred. It was found that, by using a heat resistant resin having a weight reduction temperature of 520° C. or lower, occurrence of warpage during manufacture of the thermoelectric conversion body can be suppressed, and warpage is less likely to occur even when the thickness of the thermoelectric conversion body is larger.

INDUSTRIAL APPLICABILITY

The thermoelectric conversion body according to an embodiment of the present invention can be a thermoelectric conversion body that has high electrical conductivity, can exhibit high thermoelectric conversion efficiency when used in a thermoelectric conversion module, and is less susceptible to warpage during manufacture. Therefore, the thermoelectric conversion body can be used for thermoelectric conversion bodies and thermoelectric conversion modules having a purpose that requires a high output or a purpose that requires installment in a place with limited area or a narrow place.

REFERENCE SIGNS LIST 1A, 1B: Thermoelectric conversion module
2, 21, 22: Substrate
3, 3a, 3b: Electrode
4: N-type thermoelectric element layer (N-type thermoelectric conversion body)
4a: N-type part
4b: N-type part after pressing
5: P-type thermoelectric element layer (P-type thermoelectric conversion body)
5a: P-type part
5b: P-type part after pressing
6: Thermoelectric element layer (thermoelectric conversion body)
6a: Dried coating film
7: Void part
51, 52, 53: Support
60: Pressing member
61: Frame member
81, 82: Covering layer
91, 92: High thermal conductive layer
C: Central part

The invention claimed is:

1. A thermoelectric conversion body that is a fired product of a composition comprising a thermoelectric semiconductor material and a heat resistant resin, wherein, with the heat resistant resin being subjected to temperature elevation and a weight of the heat resistant resin at 400° C. being defined as 100%, a temperature at which the heat resistant resin undergoes a further 5% reduction in weight is 520° C. or lower.

2. The thermoelectric conversion body according to claim 1, wherein, with the heat resistant resin being subjected to temperature elevation and the weight of the heat resistant resin at 400° C. being defined as 100%, the temperature at which the heat resistant resin undergoes the further 5% reduction in weight is 460° C. or higher.

3. The thermoelectric conversion body according to claim 1, having a filling rate of 80% or greater and less than 100% in a vertical cross section including a central part of the thermoelectric conversion body, the filling rate representing a proportion of an area occupied by parts other than voids.

4. The thermoelectric conversion body according to claim 1, wherein the heat resistant resin is a polyamide-imide resin.

5. The thermoelectric conversion body according to claim 1, which is a fired product of a coating film of the composition.

6. The thermoelectric conversion body according to claim 1, wherein the composition further comprises at least one of an ionic liquid or an inorganic ionic compound.

7. A thermoelectric conversion module comprising a P-type thermoelectric element layer and an N-type thermoelectric element layer,
the P-type thermoelectric element layer and the N-type thermoelectric element layer being arranged alternately,
wherein at least a pair of adjacent P-type thermoelectric element layer and N-type thermoelectric element layer are arranged apart and have one main surface electrically connected to each other and the other main surface not electrically connected to each other, and
wherein at least one of the P-type thermoelectric element layer or the N-type thermoelectric element layer is the thermoelectric conversion body described in claim 1.

8. A method for manufacturing the thermoelectric conversion body described in claim 1, the method comprising:
coating a support with the composition,
forming a coating film by drying the composition coating the support, and
forming the thermoelectric conversion body by subjecting the coating film to annealing.

9. The method for manufacturing the thermoelectric conversion body according to claim 8, wherein the forming of the thermoelectric conversion body is performed by subjecting the coating film to pressing, and subjecting the pressed coating film to annealing.

10. The method for manufacturing the thermoelectric conversion body according to claim 8, wherein, with the heat resistant resin being subjected to temperature elevation and a weight of the heat resistant resin at 400° C. being defined as 100%, the coating film is annealed at a temperature 30° C. or more lower than a temperature at which the heat resistant resin undergoes a further 5% reduction in weight.

* * * * *